US009772696B2

(12) United States Patent
Dinu et al.

(10) Patent No.: US 9,772,696 B2
(45) Date of Patent: Sep. 26, 2017

(54) SYSTEM AND METHOD FOR PHASE ERROR COMPENSATION IN SYNCHRONIZED DEVICES

(71) Applicant: STMICROELECTRONICS ASIA PACIFIC PTE LTD, Singapore (SG)

(72) Inventors: Leonard Liviu Dinu, Bailesti (RO); Chee Weng Cheong, Singapore (SG)

(73) Assignee: STMICROELECTRONICS ASIA PACIFIC PTE LTD, Singapore (SG)

( * ) Notice: Subject to any disclaimer, the term of this patent is extended or adjusted under 35 U.S.C. 154(b) by 50 days.

(21) Appl. No.: 14/199,510

(22) Filed: Mar. 6, 2014

(65) Prior Publication Data

US 2015/0256330 A1   Sep. 10, 2015

(51) Int. Cl.
| | |
|---|---|
| *H04L 7/00* | (2006.01) |
| *H04L 25/00* | (2006.01) |
| *H04L 25/40* | (2006.01) |
| *G06F 3/0354* | (2013.01) |
| *G06F 3/041* | (2006.01) |
| *H03L 7/00* | (2006.01) |

(52) U.S. Cl.
CPC ......... *G06F 3/03545* (2013.01); *G06F 3/041* (2013.01); *H03L 7/00* (2013.01); *G06F 2203/0384* (2013.01)

(58) Field of Classification Search
CPC .............................. H06F 3/044; H06F 3/03545
See application file for complete search history.

(56) References Cited

U.S. PATENT DOCUMENTS

| | | | | |
|---|---|---|---|---|
| 5,291,526 | A * | 3/1994 | Ichikawa | ................. H04L 7/08 358/410 |
| 8,797,301 | B2 * | 8/2014 | Ryshtun | ................ G06F 3/0416 178/19.03 |
| 2005/0187752 | A1 * | 8/2005 | Colby et al. | ..................... 703/19 |
| 2008/0158165 | A1 * | 7/2008 | Geaghan et al. | ............. 345/173 |
| 2009/0256820 | A1 | 10/2009 | Yanase et al. | |
| 2009/0323457 | A1 | 12/2009 | Shori | |
| 2010/0066693 | A1 * | 3/2010 | Sato et al. | ..................... 345/173 |
| 2010/0155153 | A1 * | 6/2010 | Zachut | ................ G06F 3/03545 178/18.03 |

(Continued)

*Primary Examiner* — Shuwang Liu
*Assistant Examiner* — Sung Ahn
(74) *Attorney, Agent, or Firm* — Gardere Wynne Sewell LLP

(57) ABSTRACT

A system and method for compensating for detected phase errors during communications between synchronized devices. In an embodiment, the two devices may be a touch screen device and a synchronized stylus device. To this end, the touch screen device includes a controller configured to receive data signals from the stylus at specific time intervals. The touch screen device generates an internal control signal for receiving the incoming data signals at an expected frequency. The touch screen device further includes circuitry for measuring differences in the time a data signal is actually received against when the data signal was expected to be received and determines a time difference (e.g., a phase error). Then, the internal control signal may be adjusted to compensate for the accumulated phase error. Such a measurement and compensation helps ensure that communications remain in synchronization without having to reestablish synchronization through a cumbersome synchronization process.

25 Claims, 3 Drawing Sheets

(56) References Cited

U.S. PATENT DOCUMENTS

| | | | |
|---|---|---|---|
| 2010/0212975 A1 | 8/2010 | Moon et al. | |
| 2010/0252335 A1* | 10/2010 | Orsley | 178/18.03 |
| 2011/0291985 A1 | 12/2011 | Wakako et al. | |
| 2012/0013555 A1 | 1/2012 | Maeda et al. | |
| 2012/0068964 A1* | 3/2012 | Wright et al. | 345/174 |
| 2012/0113045 A1 | 5/2012 | Lai | |
| 2012/0327041 A1* | 12/2012 | Harley et al. | 345/179 |
| 2013/0002597 A1 | 1/2013 | Nishimura et al. | |
| 2013/0027338 A1 | 1/2013 | Nishimura et al. | |
| 2013/0314361 A1* | 11/2013 | Saitoh | G06F 3/0412 345/173 |
| 2014/0018577 A1* | 1/2014 | Merschaert | C12P 13/06 564/136 |
| 2014/0267071 A1 | 9/2014 | Shahparnia | |
| 2014/0267075 A1* | 9/2014 | Shahparnia | G06F 3/03545 345/173 |
| 2014/0347311 A1* | 11/2014 | Joharapurkar et al. | 345/174 |
| 2014/0354555 A1* | 12/2014 | Shahparnia | G06F 3/03545 345/173 |
| 2014/0362035 A1* | 12/2014 | Mo | G06F 3/044 345/174 |

* cited by examiner

SYSTEM AND METHOD FOR PHASE ERROR COMPENSATION IN SYNCHRONIZED DEVICES

RELATED APPLICATION DATA

This application is related to U.S. patent application Ser. No. 14/199,210, entitled SYSTEM AND METHOD FOR IMPROVED SYNCHRONIZATION BETWEEN DEVICES filed Mar. 6, 2014, and which is incorporated herein by reference in its entirety.

BACKGROUND

Computing devices today typically include a number of different components that may be used in conjunction with each other, i.e., communicating signals between devices. Such computing devices may be configured to communicate with each other in several different ways including capacitively coupled communications. One such computing system that may utilize two different computing devices is a smart stylus device in conjunction with a touch screen device.

In this computing arrangement, a user may use a handheld stylus device having a touch screen therein capable or wireless communication with a paired device, such as a tablet computer or smart phone. When used in conjunction with each other, wireless communication between the devices may be initialized such that communication signals may be passed back and forth between the two devices. The initialization may be accomplished during a synchronization method wherein the signals to and from the stylus may be synchronized with signals to and from the paired device. After synchronization, the two devices may communicate back and forth with each other. However, noise and clock skews in communication signals may ultimately lead to disrupted communication as accumulated phase errors may lead to erroneous signal interpretation. These problems may be overcome by utilizing a phase error compensation algorithm during communications between these devices.

BRIEF DESCRIPTION OF THE DRAWINGS

The foregoing aspects and many of the attendant advantages of the claims will become more readily appreciated as the same become better understood by reference to the following detailed description, when taken in conjunction with the accompanying drawings, wherein:

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

By way of overview, the subject matter disclosed herein may be directed to a system and method for compensating for detected phase errors during communications between synchronized devices. In an embodiment discussed herein, the two devices may be a touch screen device and a stylus associated with and synchronized to the touch screen device. When communication between the two devices is to be established, a synchronization process may be invoked and a synchronization algorithm may govern the electronic components involved with the synchronization process. Once synchronization is established, normal data communications may ensue. So long as the two devices remain in synchronization, these data communications will not typically be interrupted or compromised. However, noisy environments and phase errors due to slightly unsynchronized devices may lead to a breakdown in data communications. Thus, in order to alleviate these problems that may lead to unsynchronized data communication, the various errors may be measured and addressed via control signal compensation.

To this end, the touch screen device includes a controller configured to receive the data signals at specific time intervals and in a specific signal order. The touch screen controller generates an internal phase control signal for receiving the incoming data signals at an expected frequency. The touch screen controller further includes circuitry for measuring differences in the time a data signal is actually received against when the data signal was expected to be received and determines a time difference (e.g., a phase error). After a specific number of iterations, i.e., after n pulses, various calculations may be made about the actual time differences and anticipated time differences. Then, the internal control signal may be adjusted to compensate for the accumulated phase error. Such a measurement and compensation may be accomplished after each data packet of n pulses in order to ensure that data communications remain in synchronization without having to reestablish synchronization through a cumbersome and time-consuming synchronization process. These and other aspects of the devices, systems and methods of the embodiments described herein are discussed in greater detail below with respect to FIGS. 1-5.

Figure 1:
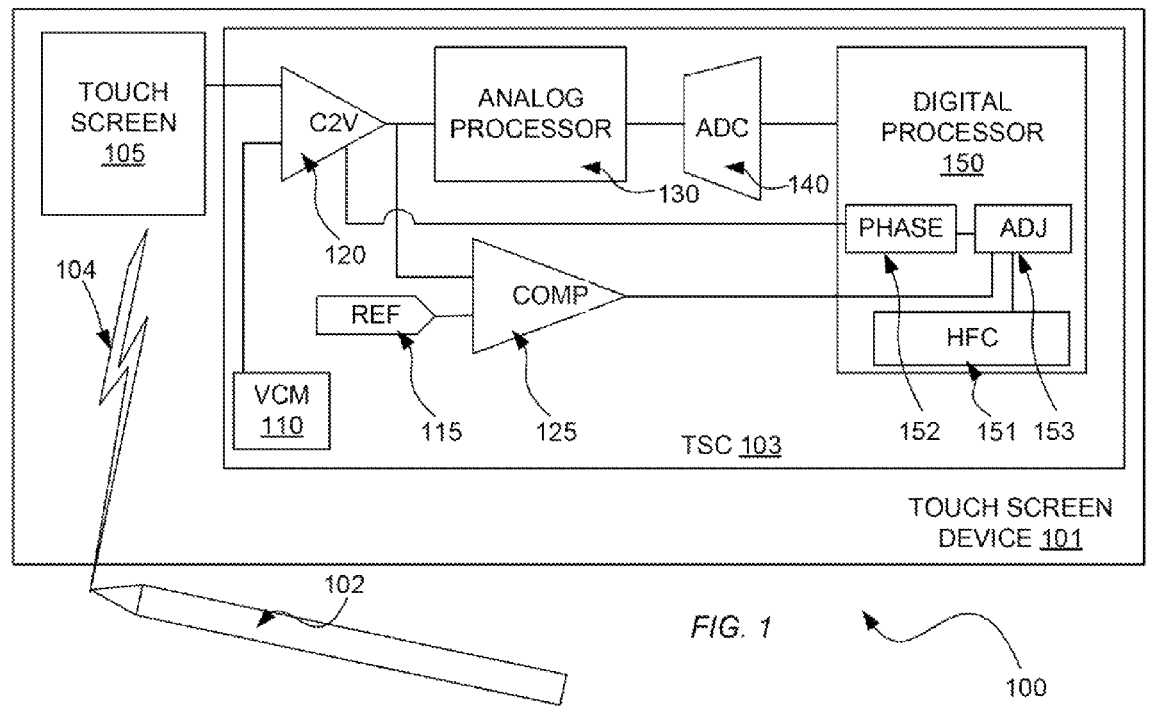
FIG. 1 is a block diagram of two devices configured to exchange communication signals using a method for phase-error compensation according to an embodiment.

FIG. 1 is a block diagram of two devices configured to have communication signals synchronized using an improved synchronization algorithm according to an embodiment. The two devices in this embodiment are a touch screen device 101 and an associated stylus 102 that together comprise the computing system 100 having the communicative capabilities as described herein. In the embodiment shown in FIG. 1, the communications signals may be received by the touch screen device 102 via a touch screen 105 that may be coupled to a touch screen controller 103. The signals received by the touch screen 105 may be done so from a remote device, such as a stylus 102 via a capacitive coupling. In this respect, the touch screen controller 103 includes a receiver to receive charge signals generated by the touch screen 105. This receiver is a charge-to-voltage converter 120 to interpret charge signals generated by the touch screen 105 via the capacitive coupling of the stylus 102. In order to provide a relative voltage output suitable for use within the touch screen controller 103, a common mode voltage reference 110 is provided as an input to the charge-to-voltage converter 120 to provide a charge basis for comparison in generating the output voltage of the charge-to-voltage converter 120. In other embodiment not shown, other communication components may be used to receive signals from the stylus 102.

Thus, communications occur between the touch screen 105 in the touch screen device 101 and the stylus 102. Such communications may result in a communication signal being received by the touch screen device 101 and sent to a touch screen controller 103 for additional processing and interpretation. To this end, in order to facilitate communication protocol between the touch screen device 101 and the stylus 102, a protocol may be followed for ensuring that signals sent to and from the stylus 102 are synchronized with signals sent to and from the touch screen device 101.

When first establishing communication between the stylus 102 and the touch screen device 101, a synchronization process and method may be employed. The stylus 102 may initiate a synchronization process when the stylus 102 is moved into proximity of the touch screen device 101. This process may begin by the stylus 102 sending synchronization signals to the touch screen device 101 to be received by the touch screen controller 103 at an expected sequence at expected intervals. Once synchronized, various communication signals may be sent and received between the two devices. In order to correctly receive and interpret the signals received from the stylus 102, the touch screen controller 103 includes a number of components working in conjunction with a digital processor 150 to ensure maintaining proper synchronization.

As shown in FIG. 1, the reference numeral 104 refers to an input to the touch screen 105. For the purposes of this disclosure this reference numeral simply refers to a signal propagating at this node. In the context of the phase error compensation algorithm discussed herein, this signal will simply be referred to as the data package signal 104 or simply data package 104 although it is understood that other signals from the stylus 102 (or any other device communicating with the touch screen controller 103) may be received here as well. Further, the data package 104 may comprise n pulses wherein each pulse includes one rising edge and one falling edge such that every n pulses are collectively referred to as a data package 104. Thus, each data package 104 is received from the stylus 102 at one input to the charge-to-voltage converter 120. In order to provide a basis for comparison of the data package received, a second input of the charge-to-voltage converter is coupled to a common mode voltage 110 for the touch screen controller 103.

As each data package 104 is received, the charge-to-voltage converter 120 generates a voltage output in response to input charge stimulus from either a rising edge or a falling edge of each pulses in the data package 104. The charge-to-voltage converter 120 is enabled by a phase control signal 152 from the processor 150 at intervals related to a high-frequency clock (HFC) 151. The HFC 151 generates various clock signals that are used within the touch screen controller 103. In an ideally synchronized situation, the frequency of the signals generated by the HFC 152 is synchronized to the frequency of the data package 104. Thus, a phase control signal 152 is generated from the HFC 151 for enabling the charge-to-voltage converter 120 at intervals related to the synchronized frequency.

Thus, when there is a rising edge in the data package 104, the output of the charge-to-voltage converter 120 will fall below a negative reference threshold after an exponential transient period. This transient period is a detection delay time that contributes to an overall delay time delta and is discussed further below with respect to the timing diagram of FIG. 2 that is associated with the embodiment of FIG. 1. Similarly, when there is a falling edge of the synchronization signal 104, the output of the charge-to-voltage converter 120 will rise above a positive reference threshold after the exponential transient period. The negative and positive thresholds may be equivalent in magnitude. In other embodiments, the thresholds may be set to be different.

The output of the charge-to-voltage converter 120 is coupled to a first input of a comparator 125. A second input of the comparator 125 is coupled to a reference threshold 115. This reference threshold 115 provides the negative and positive reference thresholds referred to above. The comparator 125 is configured to compare the output of the charge-to-voltage converter 120 with the reference threshold 115. If the charge-to-voltage converter 120 output exceeds the negative reference threshold, the comparator 125 will generate a pulse indicating detection of a rising edge in the data package 104. If the charge-to-voltage converter 120 output exceeds the positive reference threshold, the comparator 125 will generate a pulse indicating detection of a falling edge in the data package 104.

After synchronization is determined, an analog processor 130 may be initialized and used to receive signals from the output of the charge-to-voltage converter 120. The analog processor 130 conducts processing (not discussed or relevant herein) and provides analog communication signals to an analog-to-digital converter 140 for eventual use in the digital processor. As this analog path is not relevant to the phase-error correction algorithm, no further discussion is warranted.

In an ideal communication environment, frequency synchronization may be achieved and maintained by period counting using the HFC 151 and an ideal phase-control signal 152 that is based on the expected frequency of the data packet 104. However, synchronization precision may be affected by multiple factors, such as noise, the period of the HFC 151, jitter of both the stylus 102 clock and the HFC 151, time dedicated to averaging multiple periods' HFC 151 count, etc. Therefore, the determined frequency for data package 104 synchronization can have a significant error. In the time domain, this will result in an accumulating phase-error difference between the two signals having different frequencies. Eventually, the phase error will render the communication between the stylus 102 and the touch screen device 101 unreliable until the next initial synchronization.

Thus, overcoming the accumulating phase-error, without resynchronizing the device, is beneficial as resynchronization is not required and proper device communication may ensue without interruption. Phase-error compensation may be achieved by analyzing the phase between the two signals (the incoming data package 104 and the phase-control signal 152 generated based upon the HFC 151) and to make an adjustment every n periods (i.e., one data package 104) by leading/lagging the phase-control signal 152 signal at the subsequent period ((n+1)$^{th}$ period, belonging to the next data package). This adjustment may be determined by an adjuster 153 that is part of the controller 150.

Figure 2:
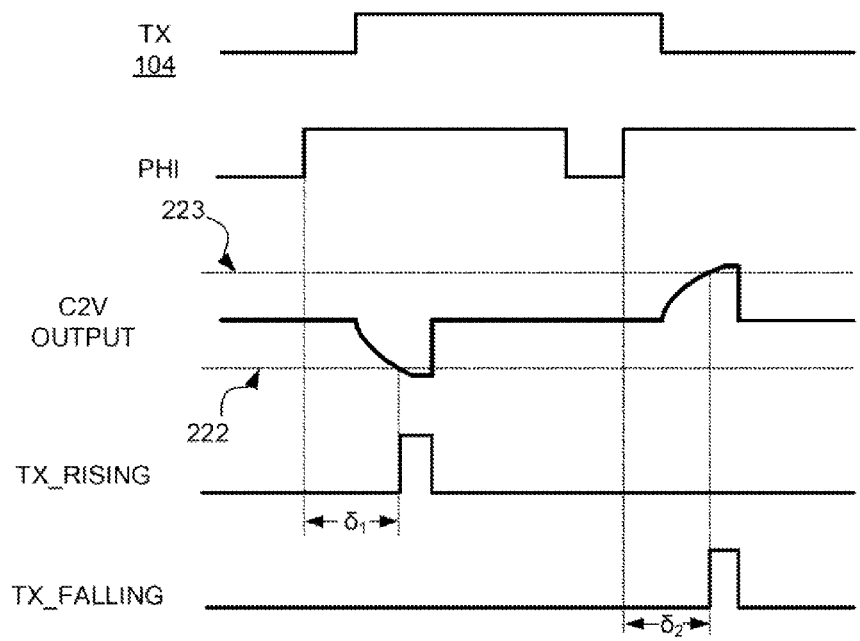
FIG. 2 is a timing diagram of communication signals in the two devices of FIG. 1 during a communication session showing a phase error according to an embodiment.

Turning attention now to the next figure, FIG. 2 shows a timing diagram of the data packet 104 sent to the touch screen device 105 and signals associated with a phase-error compensation algorithm according to an embodiment. The data package 104 sent by the stylus 102 comprises a periodic series of pulses having rising edges and falling edges. In FIG. 2, one rising edge and one falling edge is shown for illustrative purposes. However, the skilled artisan understands that the data package 104 may be comprised of any number of combinations of high logic level signals and low logic level signals in succession.

To this end, when the touch screen controller 103 is first synchronized through a synchronization procedure, the phase-control signal 152 comprises a series of pulses having a width associated with the calculated synchronization frequency. Thus, a first pulse of the phase control signal 152 enables the charge-to-voltage converter 120 just before an anticipated edge of the data package 104. Thus, when a rising edge of the data package 104 is detected, the output of the charge-to-voltage converter 120 begins falling toward the lower voltage threshold 222. Once the lower voltage threshold 222 is reached, a TX_RISING pulse is generated by the comparator 125 (FIG. 1). As one can see, the time difference between the enabling edge of the phase-control signal 152 and the generation of the TX_RISING pulse is shown as delta ($\delta_1$).

Similarly, a second pulse of the phase-control signal 152 enables the charge-to-voltage converter 120 just before a next anticipated edge of the data package 104. Thus, when the next edge (a falling edge) of the data package 104 is detected, the output of the charge-to-voltage converter 120 begins rising toward the upper voltage threshold 223. Once the upper voltage threshold 223 is reached, a TX_FALLING pulse is generated by the comparator 125 (FIG. 1). As one can see, the time difference between the disabling edge of the phase-control signal 152 and the generation of the TX_FALLING pulse is shown as another delta ($\delta_2$).

As one can see, each delta includes two particular durations of time. One duration of time included in each delta is the time between an edge of the data package 104 signal and the time at which the output of the charge-to-voltage converter 120 reaches the threshold (222 or 223) such that the comparator 125 generates an edge pulse signal. This duration of time is relatively constant with respect to successive edges as it is simply a function of the RC time constant of the charge-to-voltage converter 120. Jitter, though, may cause differences in this duration of time as caused by noise and the like.

A second duration of time, however, may vary more from edge to edge. The second duration of time is the time between an edge of the phase-control signal 152 and the edge of the data package 104 signal. This second time duration may vary if the calculated frequency of the phase-control signal 152 differs from the actual frequency of the data package signal 104. Thus, if the calculated frequency of the phase-control signal 152 is greater than the frequency of the actual data package signal 104, then the overall delta will grow larger over time as the edges of the phase-control signal 152 lead the edges of the data packet signal 104 by a greater and greater amount. After enough time, the falling edge of each phase-control signal 152 will eventually occur prior to a corresponding edge of the data packet signal 104. Thus, this edge will not be detected by the comparator 125 in the expected time frame (e.g., window) and may eventually be detected in a different window all together. Similarly, if the calculated frequency of the phase-control signal 152 is less than the frequency of the actual data package signal 104, then the overall delta will grow smaller over time as the edges of the phase-control signal 152 lead the edges of the data packet signal 104 by a smaller and smaller amount, and eventually will lag the edges of the data packet signal. This is also problematic as the rising edge of each phase-control signal 152 will eventually occur after a corresponding edge of the data packet signal 104 and again will not be detected by the comparator 125. This situation is illustrated next with respect to the discussion of FIG. 3.

Figure 3:
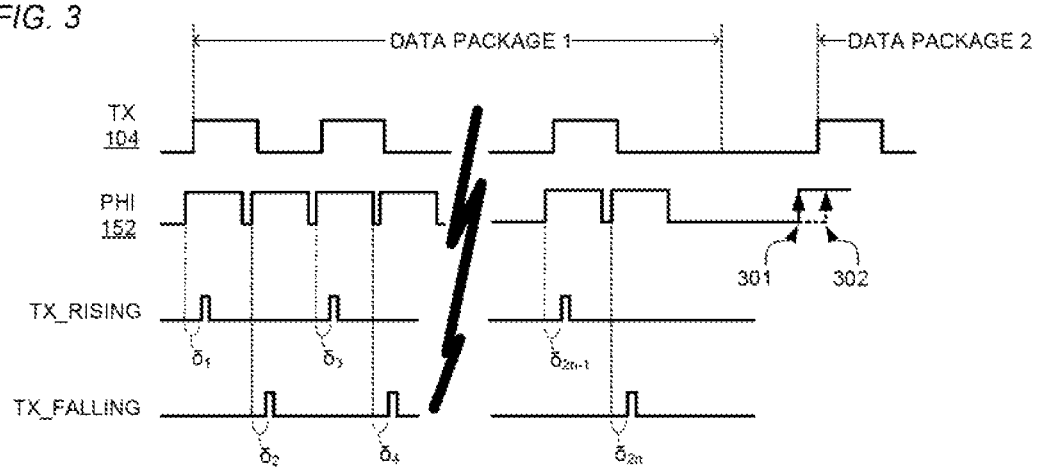
FIG. 3 is a timing diagram of communication signals in the two devices of FIG. 1 wherein phase errors are compensated for after tracking phase error accumulation according to an embodiment.

FIG. 3 is a timing diagram of communication signals in the two devices of FIG. 1 wherein phase errors are compensated for after tracking phase error accumulation according to an embodiment. As with FIG. 2, the data packet signal 104 received from the stylus 102 comprises a periodic series of pulses having rising edges and falling edges. Within one data packet, consisting of n pulses/periods, there exists 2n edges. As shown in FIG. 3, six particular edges are shown with a time break shown before the final two edges.

To this end, each delta is then associated with the respective edge. Thus, the first edge, is associated with delta $\delta 1$. The second edge is associated with delta $\delta 2$. And so on. Over the course of the data packet, the arithmetic average of all deltas may be used to calculate a compensation to be used for adjusting the phase-control signal 152. As can be seen, if the accumulation of the phase error (e.g., the summation of the deltas between the first edge and the 2nth edge of the data packet n) grows large enough, then the phase-control signal 152 will eventually shift forward/backward enough to no longer be synchronized with an edge of data packet signal 104. This is shown at far-right data packet wherein the edge 302 of the phase-control signal 152 is too late to catch the first edge of the of the second data packet 104. However, if the phase error is compensated for (as discussed below), then the time compensation of the phase-control signal 152 is implemented to where the edge 301 is shifted so as to catch the first edge of the second data packet 104.

In an ideal system, free of noise and perfectly synchronized, each delta may be known and identical. As discussed above with respect to FIGS. 2 and 3, each delta may vary due to a number of influences. For example, noise (in low signal-to-noise ratio situations) may cause random jitter that may lead to small errors in pinpointing when an edge has occurred. Further, slight differences between the synchronized frequency and the actual data packet frequency, will lead to an accumulating phase error due to signal drift such that each delta grows increasingly smaller or larger.

Jitter may be addressed and minimized by calculating the average delta for a data package 104. Thus, a data package 104 of n pulses (wherein n may typically be a power of 2), the 2n values of delta (one for the rising and another for the falling edge of each data packet 104 pulse) may be summed and averaged to yield a delta_avg:

$$\text{delta\_avg} = \frac{\sum_{i=1}^{2n} \text{delta}_{(i)}}{2n}$$

Then, the adjuster 153 may introduce an adjustment to the phase-control signal 152 according to this newly calculated average delta_avg. By using the calculated delta_avg, jitter may be addressed, but phase error may eventually lead to the problems discussed above. Therefore, one can adjust for phase error if the calculated average delta delta_avg is compared to the typical delta delta_typ from the preset ideal system (e.g., a system with perfect synchronization). Therefore, the actual adjustment phi_adj to the phase-control signal 152 may calculated by the adjuster 153 as the difference between the average delta delta_avg and the typical delta delta_typ:

$$\text{phi\_adj} = \text{delta\_avg} - \text{delta\_typ}$$

The sign of the adjustment phi_adj indicates if the phase error compensation will be a lead (negative adjustment) or a lag (positive adjustment). By comparing the calculated average delta delta_avg to the typical expected delta delta_typ, phase error is accounted for and can be corrected. Further, any drifts due to random noise may also be addressed through the averaging function over n samples in a data packet 104 of n pulses. Such adjustments to each data package 104 are illustrated with respect to FIG. 4.

Figure 4:
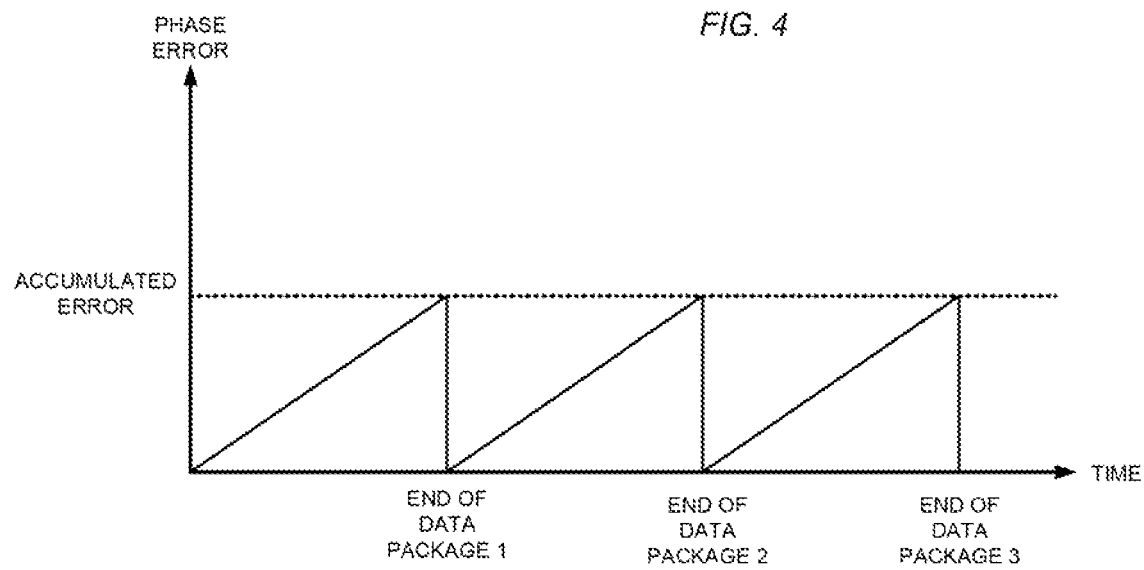
FIG. 4 is a timing diagram of the accumulation and compensation of phase-error signals in the two computing of FIG. 1 according to an embodiment.

FIG. 4 is a timing diagram of the accumulation and compensation of the phase error between the two devices of FIG. 1 according to an embodiment. The evolution in time of the phase error is shown where over the course of time for a first data packet, phase error grows linearly as the delta for each edge may grow larger and larger as the synchronization may be slightly off. After each data package, the phase error is reset by adjusting the phase-control signal 152 according to the calculated adjustment phi_adj as discussed above. Thus, after each data packet, the overall phase error that is accumulated is necessarily only accumulated for the duration of one data package 104. By measuring and compensating for both phase error and jitter, the stylus 102 and the touch screen device 101 may remain in synchronization without having to continuously repeat a synchronization procedure.

Figure 5:
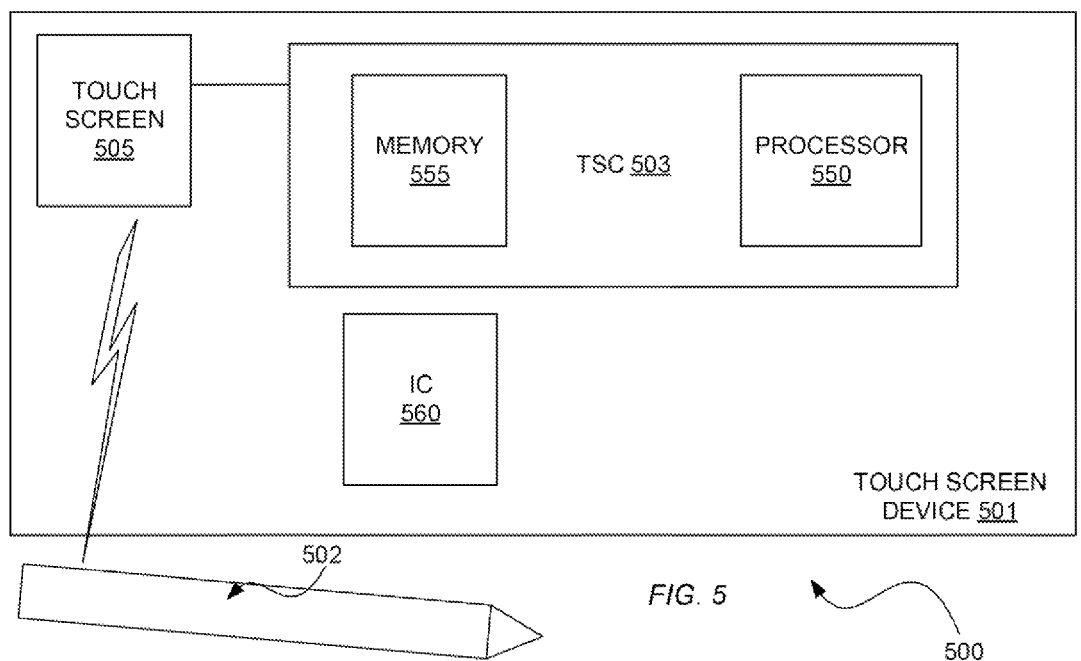
FIG. 5 is a block diagram of a computing system having the two devices of FIG. 1 according to an embodiment.

FIG. 5 is a block diagram of a computing system having the two computing devices of FIG. 1 according to an embodiment. The two devices in this embodiment are, as discussed in FIG. 1, a touch screen device 501 and an associated stylus 502 that together comprise the computing system 500 having the communicative capabilities as described herein. In the embodiment shown in FIG. 5, the communications signals may be received by and transmitted from the touch screen device 501 via a touch screen 505 that may be coupled to a touch screen controller 503.

The touch screen controller 503 may be a single integrated circuit die or multiple integrated circuit dies. Further, the touch screen controller 503 may include additional electronic components such as memory 555 or processor 550. These components may also be disposed on the same integrated circuit die or on separate integrated circuit dies. Further yet, the touch screen controller 503 may be coupled to an additional electronic component disposed on a separate integrated circuit die such as IC 560.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

What is claimed is:

1. A controller for processing a stylus signal including a plurality of data packages, wherein each data package includes plural data pulses, the controller comprising:
   a charge-to-voltage converter configured to receive said stylus signal and enabled to perform data pulse edge detection by a periodic enable control signal and output an edge detection pulse for each data pulse edge;
   a processor configured to set a phase of said periodic enable control signal by performing an initial synchronization operation with a stylus that generates said stylus signal;
   a circuit configured to determine with respect to a current data package of said stylus signal a time delay between each edge detection pulse and a corresponding edge of the periodic enable control signal for the plural data pulses within said current data package; and
   an adjuster configured to adjust said phase of the periodic enable control signal for the charge-to-voltage converter to perform data pulse edge detection with respect to all of the plural data pulses within a subsequent data package immediately following said current data package based on an accumulation of the determined time delays for the detected data pulse edges of all of the plural data pulses within said current data package.

2. The controller of claim 1, wherein the charge-to-voltage converter is configured to capacitively receive the stylus signal and further configured to compare the received stylus signal to a common mode voltage and to generate an output voltage signal related to the received stylus signal based on the comparison.

3. The controller of claim 2, further comprising a comparator configured to compare the output voltage signal to a threshold value and to generate the edge detection pulse if the output voltage signal reaches or exceeds the threshold value.

4. The controller of claim 1, further comprising a high frequency clock configured to generate the phase of the periodic enable control signal.

5. The controller of claim 1, wherein the adjustment of the phase comprises a leading shift in the phase of the periodic enable control signal.

6. The controller of claim 1, wherein the adjustment of the phase comprises a lagging shift in the phase of the periodic enable control signal.

7. The controller of claim 1, wherein the adjuster is further configured to adjust the phase based on a difference between the accumulation of the determined time delays and an expected time delay.

8. The controller of claim 1, wherein the adjuster is further configured to adjust the phase based on a difference between an average time delay determined from the accumulation of the determined time delays and a typical time delay.

9. The controller of claim 1, wherein the adjuster is further configured to adjust the phase based on an average time delay determined from the accumulation of the determined time delays.

10. A processor, comprising:
    an input configured to receive a pulsed signal wherein each pulse of said pulsed signal corresponds to a detected edge of a data pulse within a stylus signal that includes a plurality of data packages, wherein each data package includes plural data pulses;
    a clock circuit configured to generate a periodic enable control signal having a phase set in response to an initial synchronization with a stylus generating said stylus signal;
    a circuit configured to determine with respect to a current data package of said stylus signal a time delay between each pulse of said pulsed signal and a corresponding edge of the periodic enable control signal for all of the plural data pulses within said current data package received from said synchronized stylus after said initial synchronization;
    an adjuster configured to adjust said phase of the periodic enable control signal for all of the data pulses within a subsequent data package immediately following said current data package based on an accumulation of the determined time delays associated with detected data pulse edges of all of the plural data pulses within said current data package signal.

11. The processor of claim 10, wherein the adjuster further configured to adjust the phase based on a difference between the accumulation of the determined time delays and an expected time delay.

12. The processor of claim 10, wherein the adjuster is further configured to adjust the phase based on an average time delay determined from the accumulation of the determined time delays.

13. An integrated circuit, comprising:
a charge-to-voltage converter configured to receive a stylus signal including a plurality of data packages, each data package including a plurality of data pulses, from a stylus and output an edge detection pulse for each data pulse edge, said charge-to-voltage converter being enabled to perform data pulse edge detection by a periodic enable control signal;
a processor configured to set a phase of said periodic enable control signal by performing an initial synchronization operation with the stylus that generates said stylus signal;
a circuit configured to determine with respect to a current data package of said stylus signal a time delay between each edge detection pulse and a corresponding edge of the periodic enable control signal for all of the plurality of data pulses within said current data package and further determine an average value of the determined time delays for said plurality of data pulses within the current data package;
an adjuster configured to adjust said phase of the periodic enable control signal for the charge-to-voltage converter to perform data pulse edge detection with respect to all of the plurality of data pulses within a next received data package immediately following the current data package based on the determined average value of the time delays.

14. The integrated circuit of claim 13, wherein the adjuster is further configured to adjust the phase based on a difference between the determined average value and an expected value.

15. The integrated circuit of claim 13, further comprising a single integrated circuit die.

16. The integrated circuit of claim 13, further comprising multiple integrated circuit dies.

17. A method, comprising:
enabling with a periodic enable control signal an edge detection circuit to perform a detection of a data pulse edge of each data pulse within a received stylus signal including a plurality of data packages, wherein each data package includes plural data pulses;
performing an initial synchronization with a stylus generating said stylus signal to set a phase of the periodic enable control signal;
determining with respect to a current data package of said stylus signal a time delay between each detected data pulse edge and a corresponding edge of the periodic enable control signal for the plural data pulses within said current data package of the stylus signal received from the synchronized stylus after said initial synchronization; and
adjusting said phase of the periodic enable control signal to for enable the edge detection circuit to perform data pulse edge detection with respect to all of the plural data pulses within a subsequent data package immediately following said current data package based on an accumulation of the determined time delays for all of the plural data pulses within the current data package signal.

18. The method of claim 17, further comprising:
capacitively receiving the stylus signal;
comparing the received stylus signal to a common mode voltage; and
generating an output voltage signal related to the received stylus signal based on the comparison.

19. The method of claim 18, further comprising:
comparing the output voltage signal to a threshold value; and
generating the edge detection pulse if the output voltage signal reaches or exceeds the threshold value.

20. The method of claim 17, further comprising generating the phase of the periodic enable control signal from a high frequency clock.

21. The method of claim 17, further comprising generating a leading shift in the phase of the periodic enable control signal.

22. The method of claim 17, further comprising generating a lagging shift in the phase of the periodic enable control signal.

23. The method of claim 17, further comprising adjusting the phase based on a difference between the accumulation of the determined time delays and an expected time delay.

24. The method of claim 17, further comprising adjusting the phase based on a difference between an average time delay determined from the accumulation of the determined time delays and a typical time delay.

25. The method of claim 17, further comprising adjusting the phase based on an average time delay determined from the accumulation of the determined time delays.

* * * * *

UNITED STATES PATENT AND TRADEMARK OFFICE
CERTIFICATE OF CORRECTION

PATENT NO. : 9,772,696 B2
APPLICATION NO. : 14/199510
DATED : September 26, 2017
INVENTOR(S) : Leonard Liviu Dinu et al.

Page 1 of 1

It is certified that error appears in the above-identified patent and that said Letters Patent is hereby corrected as shown below:

In the Specification

At Column 6, Line number 13, please replace the words [[delta M]] with the term -- $\delta 1$ --.

In the Claims

At Column 10, Claim number 17, Line number 12, please delete the word "for".

At Column 10, Claim number 17, Line number 18, please delete the word "signal".

Signed and Sealed this
Fourteenth Day of November, 2017

Joseph Matal
*Performing the Functions and Duties of the*
*Under Secretary of Commerce for Intellectual Property and*
*Director of the United States Patent and Trademark Office*